Figure 2A:
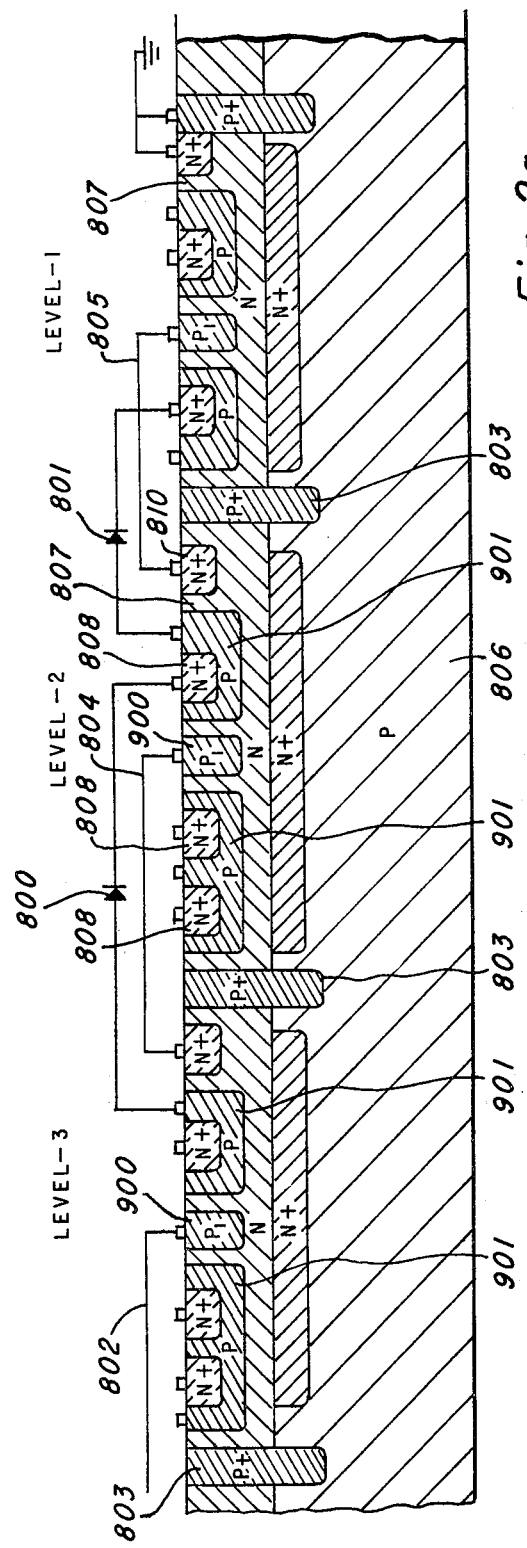

United States Patent [19]

Williams

[11] 4,013,901
[45] Mar. 22, 1977

[54] STACKED LOGIC DESIGN FOR I²L WATCH
[75] Inventor: Clark R. Williams, Plano, Tex.
[73] Assignee: Texas Instruments Incorporated, Dallas, Tex.
[22] Filed: Feb. 19, 1974
[21] Appl. No.: 443,535
[52] U.S. Cl. .............................. 307/296; 307/213; 307/303; 307/313; 357/40; 357/44
[51] Int. Cl.² ..................... H03K 1/02; H03K 19/08
[58] Field of Search .......... 307/213, 215, 218, 296, 307/303, 313; 357/40, 44

[56] References Cited
UNITED STATES PATENTS 3,119,935  1/1964  Samusenko ................... 307/218 X
3,446,989  5/1969  Allen et al. ................... 307/291 X Primary Examiner—John Zazworsky
Attorney, Agent, or Firm—Harold Levine; Rene' E. Grossman; Stephen S. Sadacca

[57] ABSTRACT

An electronic timekeeping system is implemented in bipolar integrated circuit technology for displaying time by way of a digital display. The bipolar circuitry is implemented utilizing integrated injection logic and is interconnected with a plurality of circuit elements connected in parallel in levels such that the levels are electrically stacked and serially diode coupled.

14 Claims, 4 Drawing Figures

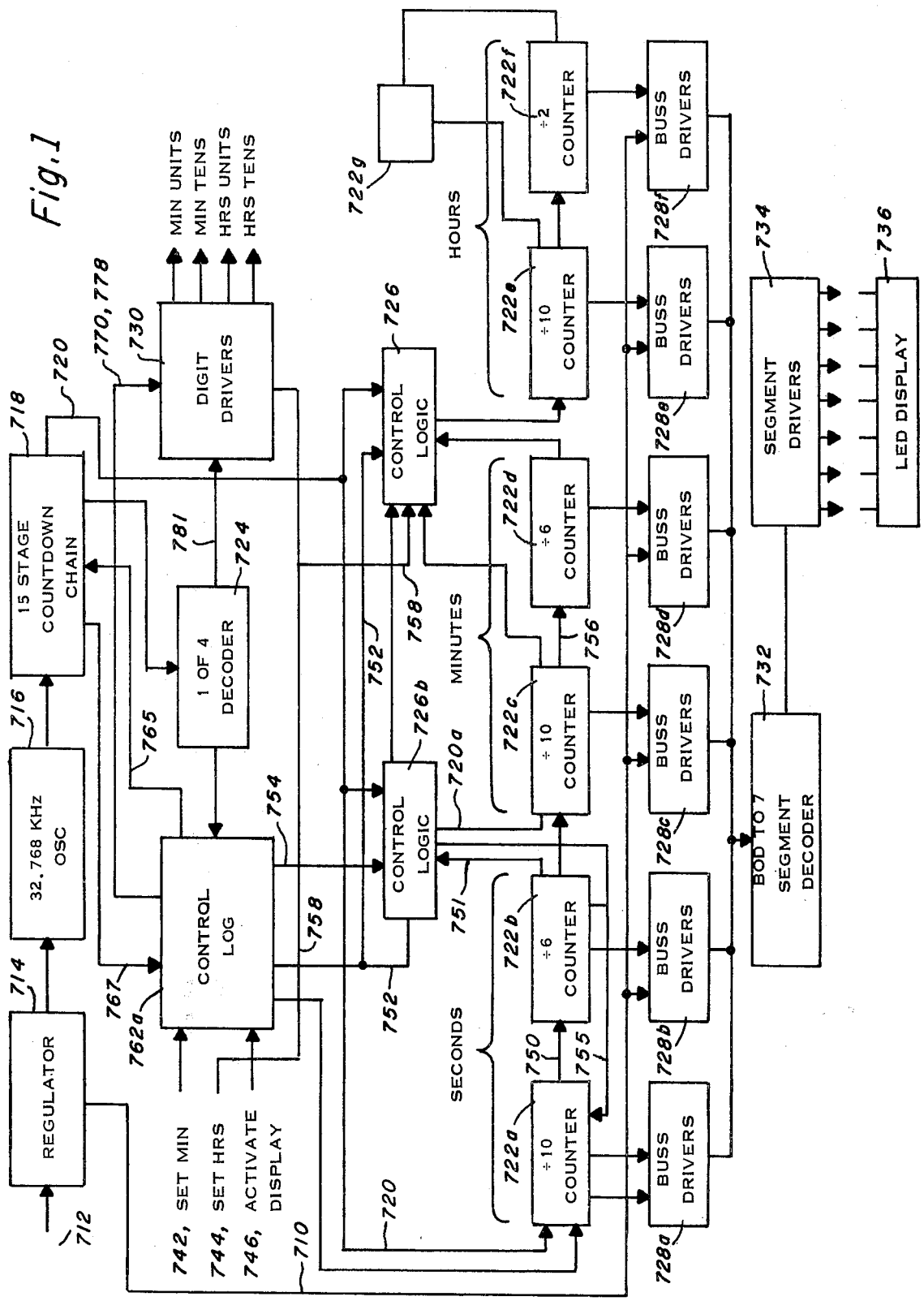

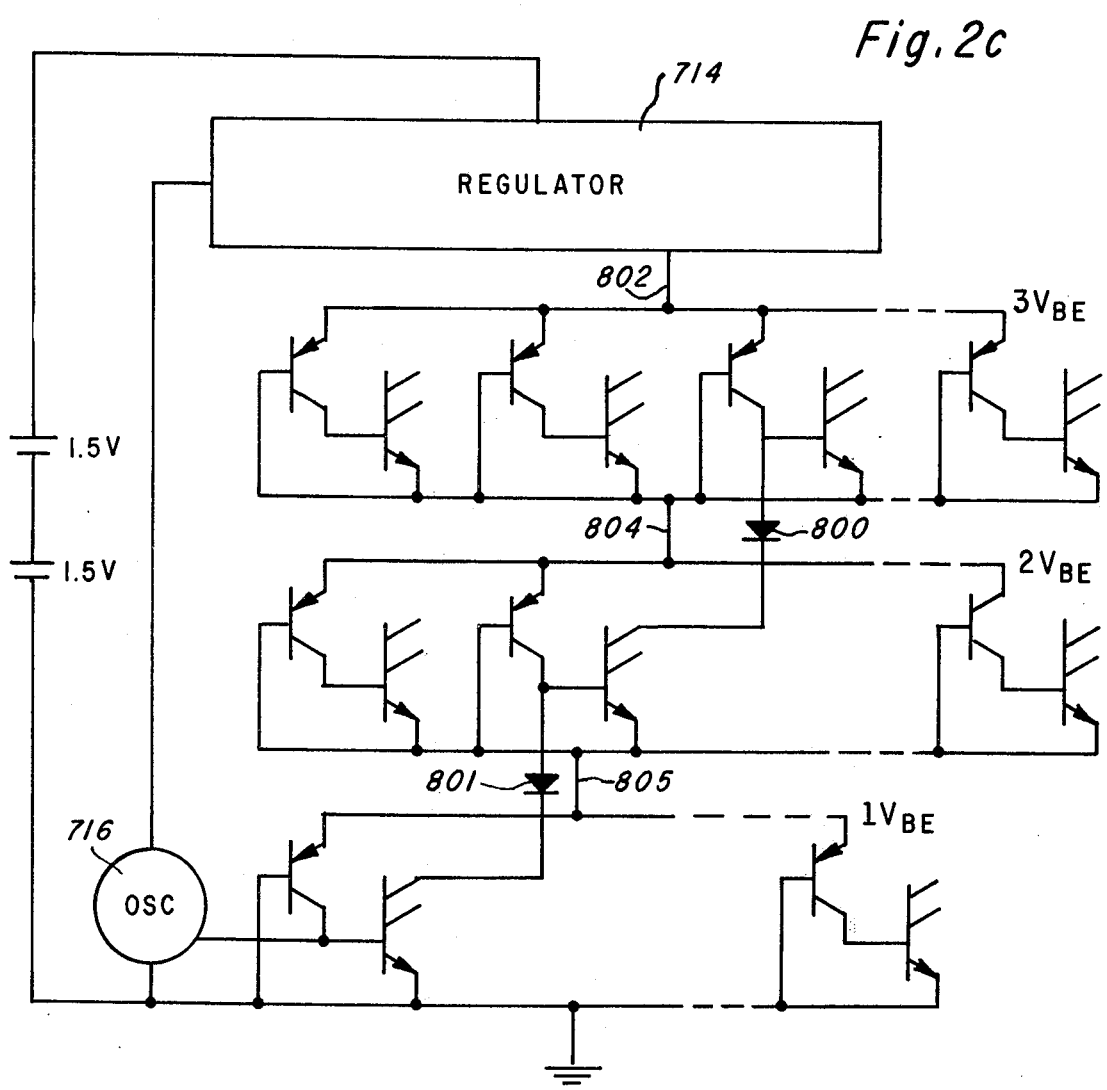

STACKED LOGIC DESIGN FOR I²L WATCH

The present invention relates to electronic timekeeping devices in general and more particularly to the bipolar integrated injection logic implementation thereof.

Digital electronic timekeeping devices of sufficiently low power dissipation so as to allow application in a wristwatch have been described extensively in the literature. Complementary metal oxide semiconductor circuitry has been proposed utilizing asynchronous counters driving other asynchronous counters and is commercially available in the market place for actuating both VLED and liquid crystal type digital displays. Furthermore, bipolar electronic circuitry of the low power dissipation type and having synchronous counters has been proposed such as in copending patent application, "Electronic Timekeeping System", Ser. No. 264,212, filed June 19, 1972, by Williams et al.

Problems inherent in providing a digital wristwatch have been defined and are well known. For example, the watch circuitry must be configured so as to minimize power drain so as to maximize life of the watch battery. Furthermore, a technology must be utilized which lends itself readily to integrated circuit application, thereby requiring parameters and limitations suitable to the integration process. For example, process parameters must be well controlled and reproducible, and device geometries must be such so as to maximize device density in the integrated circuit chip. Still further, if a relatively new technology is utilized in the integrated circuit process, conventional logic and functional circuits must be redesigned to implement the function most efficiently.

Low power, high circuit density bipolar integrated circuit concepts have been proposed utilizing the recently disclosed integrated injection logic (I²L). See, for example, U.S. Pat. No. 3,736,477 which defines in detail the semiconductor structure of integrated injection logic wherein a lateral PNP transistor is utilized as an injector to an inversely operated NPN vertical transistor. Discussion thereof is further found in Integrated Injection Logic, *Microelectronics and Reliability*, Pergamon Press, 1972, (Great Britain), Volume 11, page 94, and in Integrated Logic Circuits, *IEEE International Solid State Circuits Conference*, 1972, pages 90–93. Application of such integrated injection logic circuitry into an electronic digital wristwatch has also been suggested utilizing logic directly coupled in electronic stacks.

Accordingly, an object of the present invention is to provide an electronic digital watch in integrated injection logic whereby circuit components are electrically stacked in series with the stacks intercoupled by diodes. Another object of the invention is to provide such an integrated injection logic watch with a countdown chain having graded power due to varying transistor geometries such as varying injector geometries. Yet another object of the invention is the provision of an electrically stacked oscillator/regulator series combination in such an I²L watch to reduce system power consumption. Still another object of the present invention is the utilization of asynchronous counters synchronized with the system clock signal between functions, preferably utilizing D flip-flops implemented in integrated injection logic and having respective Q outputs fed back to the $\bar{D}$ inputs for minimizing component requirements.

Briefly, and in accordance with the present invention, a bipolar electronic watch is implemented in integrated injection logic such that the countdown chain and counters are partitioned into a plurality of levels which are serially connected between first and second reference potentials, with the logic levels interconnected through a series diode. Current passes through one level for actuating the parallel connected elements therein, and is then collected and coupled to the succeeding level and so forth. The various levels have differing number of gates connected in parallel in each, and geometry of the emitter injector elements vary for grading the power distribution. Asynchronous counters are synchronized with the system clock so that the system clock is selectively input into the succeeding counter instead of the previous counter output for minimizing gate logic requirements. A current regulator is connected in series with an oscillator and is configured so as to provide a highly regulated timekeeping signal with a minimum of system power consumption. D flip-flops comprising the countdown chain are implemented such that the Q output thereof is fed back to a $\bar{D}$ input for minimizing component requirement. The injector in the integrated injection logic gates has a geometry varying so as to regulate and control power supplied to the respective gate.

Figure 2B:
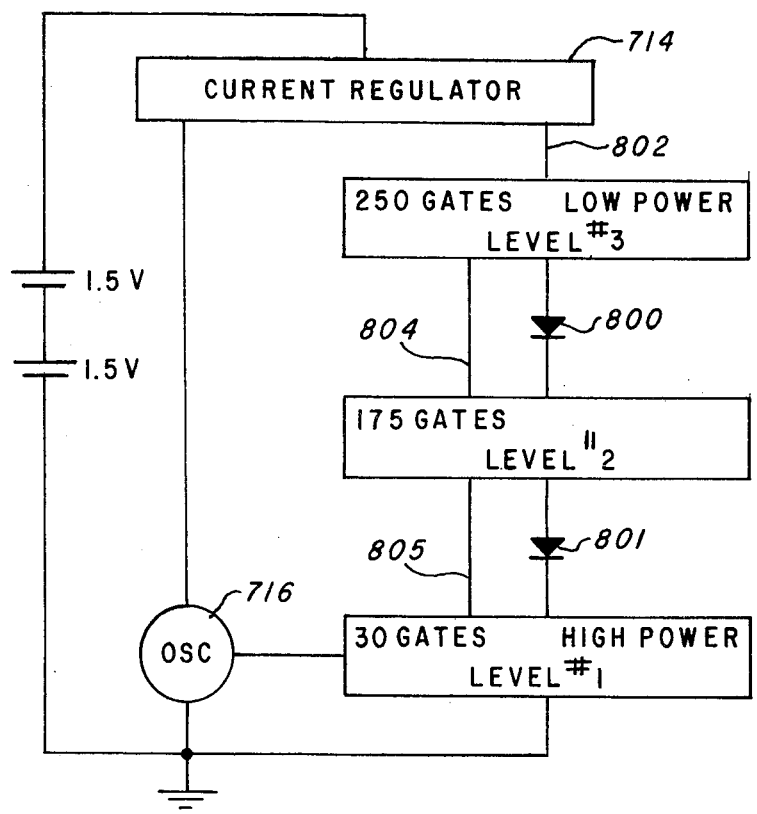

Other objects and advantages of the invention will be apparent upon reading the following detailed description of illustrative embodiments in conjunction with the drawings, wherein:

FIG. 1 is a functional block diagram of an I²L electronic digital wristwatch utilizing the system of the present invention; and FIGS. 2a–2c depict the stacked logic levels of the I²L logic in accordance with the invention.

With reference to the drawings, a functional description of a general watch system, which is implemented as a stacked logic system according to the present invention and preferably utilizes I²L circuit implementation.

For a complete description of the electronic digital wristwatch of FIG. 1, including a complete description of the I²L circuitry thereof, reference is made to U.S. Pat. No. 3,965,666, issued to Clark R. Williams, the inventor of the present invention on June 29, 1976. The specification of U.S. Pat. No. 3,965,666 is hereby incorporated herein by reference and made a part hereto.

The digital system of the invention, an example of the utilization of which is the I²L circuitry of the watch of FIG. 1, is henceforth described in detail.

Referring now to FIGS. 2a–2c, there is depicted a cross-sectional representation and functional and device representations of the electronic system of FIG. 1 wherein the integrated injection logic circuitry is implemented in serially connected stacked regions separated by diodes. The gate cell depicted in each of levels 1–3 is as generally shown and described in the above referenced 1972 IEEE ISSCC article. This is a P type substrate 806 is Boron doped to a resistivity of 10–20 ohm-centimeters and has an overlying epitaxial layer 807 of 0.19–0.23 mils thickness. Layer 807 has a resistivity P of 0.3–±.02 ohm-centimeters. Underlying the I²L logic cell is an N⁺ antimony doped DUF layer having a sheet resistivity $\rho_s$ of 10–16 ohms per square and a thickness of 0.37–0.43 mils for lowering the emitter resistance. P+ isolation diffusion areas 802 extend into the substrate 806 for isolating and forming each logic level. P type regions 900 and 901 are Boron doped to a sheet resistance of 180–300 ohm/square and extend into the epitaxial layer 807 approximately 9–10 Hg lines. N+ regions 808 and 810 exhibit a shut resistivity of 4–12 ohm/square and extend into P region 901 approximately 7–8 Hg lines. The above semiconductor structure may be effected utilizing state of the art Schottky TTL type processing; for example, utilizing standard Schottky photolithographic technique and design layouts.

Regions 900-810-901 form the lateral PNP transistor utilized as the injector, with region 900 serving as the emitter thereof. Regions 808-901-810 function as the inversely operated vertical NPN transistor.

A major improvement is the P substrate and the selective isolation by regions 802 of various combinations of cells into electronic logic level and then the selective interconnection of levels by means of diodes 800 and 801. The basic concept of electronically stacking levels on a single substrate is specifically disclaimed by the applicant of this invention, but the inclusion of diodes 800 and 801 between logic levels is a technical advance in the art. That is, the inclusion of diodes 800 and 801 with the cathode connected to the N+ collector region of the vertical, inverse transistor in one layer and the anode of the diode connected to the P conductivity collector region of the lateral PNP transistor in another level reduces the amount of voltage swing on the collector in the one region. This effects a faster switching speed and improves circuit performance.

Referring now to FIGS. 2b and 2c, there is shown a specific partitioning of the electronic digital watch system of FIG. 1 into the various stacked logic levels. FIG. 2c shows a specific circuit representation of the interconnection between logic levels as functionally depicted in FIG. 2b. For the low power digital watch of this invention, a predesignated amount of current preferably 6 microamps is generated by a pair of nominally 1.5 volt batteries is controlled by regulator 714. The current regulator 714 consumes and distributes 2 microamps to the oscillator 716 and distributes 4 microamps to the countdown and other divider circuitry. It is thus seen that only regulated current is communicated to the timekeeping circuitry of this invention for effecting a highly reliable and more efficient circuit. It is further seen that the 2 $\mu$a regulated current used by the regulator is not wasted, but is used by the series connected oscillator in generating the 32.768 KHz signal.

The 4 microamps current provided by current regulator 714 is impressed upon logic level 3 consisting generally of the counters 722 and decoder 732. The 4 microamps injector current is communicated to the counters and decode by way of line 802. As shown in FIG. 2b, there are approximately 250 gates in this No. 3 logic level, and these counters are operating at a maximum frequency of 1 Hertz. Such is a relatively low frequency, and accordingly the flip-flops comprising the counters require a relatively small amount of drive current. Therefore, a relatively large number of gates are placed on this level, and the 4 $\mu$a sufficient drive for the number of gates chosen. Graded power is discussed in more detail in allowed copending Patent Application Ser. No. 443,585, filed of even date with the present application which application is hereby incorporated herein by reference and made a part hereof. The regulator 714/oscillator 716 combination, which generates the basic high frequency timing signal to the count down chain is described in detail and claimed in the referenced U.S. Pat. No. 3,965,666.

The 4 microamps injector current in level 3 is collected in the substrate denoted by a single bar representation in FIGS. 4a–4k of the referenced U.S. Pat. No. 3,965,666 and is communicated via coupling 804 to the level 2 logic as shown in FIG. 4c of said referenced patent near transistor 28. Level 2 is comprised of approximately 175 gates and is denoted by a two bar reference potential symbol in FIGS. 4a–4k of the referenced U.S. Pat. No. 3,965,666 on the emitters of the I²L transistors. Level 2 is comprised essentially of the control circuitry 726, the digit driver circuitry 730, the one-our-of-four decode 724, and part of the countdown chain 718. Shown interconnecting level 2 and level 3 is diode 800 (representing D13–D18 in FIGS. 4a–4k in the referenced U.S. Pat. No. 3,965,666) above described for improving circuit performance.

The approximately 4 microamps current is collected in the level 2 substrate and communicated via coupling 805 (near transistor 126 in FIG. 4a of said referenced patent) into the first high power level. Level 1 is comprised essentially of the higher speed flip-flops of the countdown chain, wherein the current is not shared equally by each flip-flop. Their geometries are designed such that the power is graded; that is, one flip-flop gets 1.6 microamps, the second gets 0.8 microamps, the third gets 0.4 microamps, the fourth gets 0.2 microamps, etc. due to decreasing geometries. This power grading is to maximize the speed power product, so that only the power needed to drive the flip-flop at its intended frequency is supplied thereto. For example, the 32 kilohertz oscillator 716 drives the first flip-flop in the countdown chain at 32 KHz which requires the most power. The second flip-flop is driven at 16 KHz which requires the next greatest amount of power, and the third flip-flop is driven at 8 kilohertz requiring the next greatest amount of power and so forth.

It will be appreciated that a bipolar electronic watch has been provided implemented in bipolar integrated injection logic. As the requisite system speed, power consumption is minimal, and as little as 6 microamps is required to drive the timing circuitry. Further, power savings is effected by grading the power supplied to the countdown chain in that the geometries of the emitter of the injector transistor are varied such that flip-flops operating at a higher frequency receive more injection current. Still further, power savings is effected by coupling the oscillator which provides the system clock in series with the regulator such that current utilized by the regulator in generating its regulated output is reconsumed by the oscillator. Therefore, overall system power consumption is reduced. The electronic circuitry of the system is partitioned into a plurality of electronic levels which are series interconnected by a diode. Accordingly, each logic level uses the same amount of current and further reduces system power consumption. The diode connecting the logic levels reduces the voltage swing of the transistor interfacing the interconnected logic level and therefore reduces switching time and improves circuit performance. Application of a D toggle flip-flop having its outputs inverted and its D input inverted allows an I²L implementation which eliminates one transistor or one collector of a multi-collector transistor over a conventional D toggle flip-flop configuration. To reduce logic circuitry otherwise required, asynchronous counters are used for the seconds, minutes and hours counters, and the output of each respective counter is used as a gating input for gating the 1 Hertz system clock into the next counter.

While various embodiments have been described in detail herein of an I²L electronic wristwatch, various changes will be apparent to those skilled in the art without departing from the spirit or scope of the invention.

What is claimed is:

1. A digital system in the form of a monolithic semiconductor integrated circuit which is energizable from a single power source of predetermined magnitude connected between first and second terminals thereof, said system comprised of:
   a. first and second logic levels each having at least one logic input and at least one logic output, each of said logic levels being comprised of a plurality of interconnected logic elements with each of said logic elements being comprised of semiconductor devices and having first and second power electrodes for energization thereof;
   b. first means coupling the first power electrodes of the logic elements of said first level in common to said first terminal;
   c. second means electrically coupling the second power electrodes of the logic elements of said second level in common to said second terminal;
   d. third means electrically coupling the second electrodes of the logic elements of said first level in common to the first electrodes of the logic elements of the second level; and
   e. a PN junction device coupling the at least one logic output of said first level to the at least one logic input of said second level.

2. The digital system according to claim 1 wherein said PN junction device is a diode.

3. The digital system according to claim 1 wherein each of said logic elements is comprised of at least one pair of transistors, each pair including a vertical NPN transistor and a lateral PNP transistor, said lateral PNP transistor being coupled between the first and second power electrodes of the element and to the base of the NPN transistor of the pair for providing base injection drive into such NPN transistor.

4. The digital system according to claim 3 wherein said PN junction device couples the base of an NPN transistor of a logic element of said first level to the collector of an NPN transistor of a logic element of said second level.

5. The digital system according to claim 4 wherein the P-type region of said PN junction device is connected to the base of the NPN transistor of the logic element of said first level and the N-type region of said PN junction device is connected to the collector of the NPN transistor of the logic element of said second level.

6. The digital system according to claim 3 wherein the emitter of each of said PNP transistors is coupled to the first power electrode of the respective logic element, the base of each of said PNP transistors is coupled to the second power electrode of the respective logic element and the collector of each of said PNP transistors is coupled to the base of the NPN transistor of the pair.

7. The digital system according to claim 1 wherein said first means includes a constant current regulator coupling the first power electrodes of the logic elements of said first level in common to said first terminal.

8. The digital system according to claim 1 wherein said second means includes additional logic levels in cascade being coupled between the commonly coupled second power electrodes of the logic elements of said second level and said second terminal.

9. A digital system in the form of a monolithic semiconductor integrated circuit which is energizable from a single power source of predetermined magnitude connected between first and second terminals thereof, said system comprised of:
   a. N cascaded logic levels each having at least one logic input and at least one logic output and being comprised of a plurality of electrically interconnected logic elements;
   b. each of said logic elements being comprised of one or more pairs of bipolar semiconductor transistors and having first and second power electrodes for energization thereof;
   c. a first transistor of each pair being coupled between said first and second electrodes for providing driving current to the second transistor of the pair;
   d. the first power electrodes of the logic elements of a first of said N levels coupled in common to said first terminal;
   e. the second power electrodes of the logic elements of the $N^{th}$ level coupled in common to said second terminal;
   f. the second power electrodes of the logic elements of the first to $(N-1)^{th}$ levels respectively coupled in common to the first power electrodes of the logic elements of the second to $N^{th}$ levels respectively coupled in common; and
   g. PN junction devices coupling the at least one logic outputs of said first to $(N-1)^{th}$ levels respectively to the at least one logic inputs of said second to $N^{th}$ levels.

10. The digital system according to claim 9 wherein each of said PN junction devices is a diode.

11. The digital system according to claim 9 wherein said second transistor of each of said pairs is vertical NPN transistor and said first transistor of each of said pairs is a lateral PNP transistor.

12. The digital system according to claim 11 wherein said PN junction devices respectively couple the base of an NPN transistor coupled to the at least one logic output of the 1st - $(N-1)^{th}$ logic levels to the collector of an NPN transistor coupled to the at least one logic input of the 2nd-$N^{th}$ logic levels.

13. The digital system according to claim 11 wherein the emitter of each of said PNP transistors is coupled to the first power electrode of the respective logic element, the base of each of said PNP transistors is coupled to the second power electrode of the respective logic element and the collector of each of said PNP transistors is coupled to the base of the NPN transistor of the pair.

14. The digital system according to claim 9 including a constant current regulator for coupling said power source between said first and second terminals.

* * * * *